(12) United States Patent
Suen et al.

(10) Patent No.: US 9,287,417 B2
(45) Date of Patent: Mar. 15, 2016

(54) SEMICONDUCTOR CHIP PACKAGE AND METHOD FOR MANUFACTURING THEREOF

(71) Applicant: XINTEC INC., Zongli, Taoyuan County (TW)

(72) Inventors: Wei-Luen Suen, New Taipei (TW);
Shu-Ming Chang, New Taipei (TW);
Yu-Lung Huang, Daxi Township (TW);
Yen-Shih Ho, Kaohsiung (TW);
Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/157,379

(22) Filed: Jan. 16, 2014

(65) Prior Publication Data
US 2014/0203387 A1    Jul. 24, 2014

Related U.S. Application Data

(60) Provisional application No. 61/754,482, filed on Jan. 18, 2013.

(51) Int. Cl.
*H01L 23/58* (2006.01)
*H01L 31/02* (2006.01)
(Continued)

(52) U.S. Cl.
CPC ...... *H01L 31/02005* (2013.01); *H01L 21/6836* (2013.01); *H01L 21/76898* (2013.01); *H01L 21/78* (2013.01); *H01L 23/3114* (2013.01); *H01L 23/481* (2013.01); *H01L 24/02* (2013.01); *H01L 24/13* (2013.01); *H01L 24/92* (2013.01); *H01L 24/94* (2013.01); *H01L 23/3171* (2013.01); *H01L 23/525* (2013.01); *H01L 24/11* (2013.01); *H01L 2221/6834* (2013.01); *H01L 2221/68304* (2013.01); *H01L 2221/68327* (2013.01); *H01L 2221/68368* (2013.01); *H01L 2221/68372* (2013.01); *H01L 2221/68381* (2013.01); *H01L 2224/0239* (2013.01); *H01L 2224/02313* (2013.01); *H01L 2224/02371* (2013.01); *H01L 2224/02372* (2013.01); *H01L 2224/0401* (2013.01); *H01L 2224/11002* (2013.01); *H01L 2224/1148* (2013.01); *H01L 2224/11472* (2013.01);
(Continued)

(58) Field of Classification Search
CPC ................ H01L 31/02005; H01L 21/76898; H01L 21/6836; H01L 21/78; H01L 2924/3511; H01L 23/3171
See application file for complete search history.

(56) References Cited

U.S. PATENT DOCUMENTS

2009/0321863 A1*  12/2009  Borthakur ........... H01L 21/6835
                                                                257/432
2010/0053922 A1*  3/2010   Ebefors ................ H01L 21/762
                                                                361/772

(Continued)

*Primary Examiner* — Su C Kim
(74) *Attorney, Agent, or Firm* — Liu & Liu

(57) ABSTRACT

Disclosed herein is a semiconductor chip package, which includes a semiconductor chip, a plurality of vias, an isolation layer, a redistribution layer, and a packaging layer. The vias extend from the lower surface to the upper surface of the semiconductor chip. The vias include at least one first via and at least one second via. The isolation layer also extends from the lower surface to the upper surface of the semiconductor chip, and part of the isolation layer is disposed in the vias. The sidewall of the first via is totally covered by the isolation layer while the sidewall of the second via is partially covered by the isolation layer. The redistribution layer is disposed below the isolation layer and fills the plurality of vias, and the packaging layer is disposed below the isolation layer.

18 Claims, 8 Drawing Sheets

(51) Int. Cl.
*H01L 23/31* (2006.01)
*H01L 23/48* (2006.01)
*H01L 21/768* (2006.01)
*H01L 21/78* (2006.01)
*H01L 23/00* (2006.01)
*H01L 21/683* (2006.01)
*H01L 23/525* (2006.01)

(52) U.S. Cl.
CPC .............. *H01L 2224/131* (2013.01); *H01L 2224/13022* (2013.01); *H01L 2224/13024* (2013.01); *H01L 2224/13111* (2013.01); *H01L 2224/92* (2013.01); *H01L 2224/94* (2013.01); *H01L 2924/3511* (2013.01)

(56) References Cited

U.S. PATENT DOCUMENTS

| | | | |
|---|---|---|---|
| 2010/0171226 A1* | 7/2010 | West et al. | 257/774 |
| 2010/0237472 A1 | 9/2010 | Gillis et al. | |
| 2012/0091515 A1* | 4/2012 | Yoo et al. | 257/292 |
| 2012/0156823 A1* | 6/2012 | Myung et al. | 438/65 |

* cited by examiner

SEMICONDUCTOR CHIP PACKAGE AND METHOD FOR MANUFACTURING THEREOF

RELATED APPLICATIONS

This application claims priority to U.S. provisional Application Ser. No. 61/754,482, filed Jan. 18, 2013, which is herein incorporated by reference.

BACKGROUND

1. Field of Invention

The present invention relates to a package and a method for manufacturing thereof. More particularly, the present invention relates to a semiconductor chip package and a method for manufacturing thereof.

2. Description of Related Art

Recently, integrated circuit devices are widely applied to consumer electronic products and portable electronics such as digital camera, digital video recorder, and mobile phone. When these kinds of electronic products are increasing popular and light-weighted, sizes of semiconductor chip packages in the products are accordingly minimized. Therefore, the integrated density of devices in the semiconductor chip package is significantly increased and distances between metal lines in the semiconductor chip package are also narrowed. Therefore, issue of electrical coupling caused by aforementioned phenomenon is getting worse, and signal interference between the devices or the metal lines is frequently occurred. Accordingly, a ground via disposed in the semiconductor chip package is one of the solutions for above issues. However, in fabricating the ground via, extra mask and corresponding litho-etching processes are required, therefore cost on fabricating a semiconductor chip package is increased.

SUMMARY

The present disclosure provides a semiconductor chip package, which has smaller size and the ground via of the semiconductor chip package is not fabricated by extra mask and corresponding litho-etching processes. Therefore, the cost on fabricating the semiconductor chip package is decreased.

The present disclosure, in one aspect, relates to a semiconductor chip package. The semiconductor chip package includes a semiconductor chip, a plurality of vias, an isolation layer, a redistribution layer, and a packaging layer. The semiconductor chip has at least one sensor device and at least one connecting pad structure. The sensor device is disposed on an upper surface of the semiconductor chip, and the connecting pad structure is electrically connected to the sensor device. The plurality of vias is extending from a lower surface of the semiconductor chip to the upper surface of the semiconductor chip. The plurality of vias includes at least one first via and at least one second via. The first via is contacting the connecting pad structure and exposing a part of the connecting pad structure. The second via is not contacting the connecting pad structure. The isolation layer is extending from the lower surface to the upper surface of the semiconductor chip. A part of the isolation layer is disposed in the vias, and the part of the isolation layer is fully covering a sidewall of the first via and partially covering a sidewall of the second via. The redistribution layer is disposed below the isolation layer and extending from the lower surface to the upper surface of the semiconductor chip. A part of the redistribution layer disposed in the vias. The redistribution layer in the first via is electrically connected to the sensor device through the connecting pad structure. The packaging layer is disposed below the redistribution layer.

In various embodiments of the present disclosure, a depth of the first via extending from the lower surface to the upper surface is substantially the same with a depth of the second via extending from the lower surface to the upper surface.

In various embodiments of the present disclosure, the second via has a radius substantially not greater than 15 μm.

In various embodiments of the present disclosure, the sensor device is an optical device.

In various embodiments of the present disclosure, a shortest distance from a light-receiving surface of the optical device to a bottom surface of the packaging layer is substantially not greater than 100 μm.

In various embodiments of the present disclosure, further including at least one solder ball disposed below the lower surface of the semiconductor chip, and the solder ball is electrically connected to the redistribution layer.

In various embodiments of the present disclosure, the solder ball has a ball diameter substantially not greater than 50 μm.

The present disclosure, in the other aspect, relates to a method of manufacturing a semiconductor chip package. The method includes providing a substrate, wherein the substrate is defined into a plurality of semiconductor chip area, each semiconductor chip area has at least one semiconductor chip, the semiconductor chip has a sensor device and at least one connecting pad structure, wherein the sensor device is disposed on an upper surface of the semiconductor chip, and the connecting pad structure is electrically connected to the sensor device, a first adhesive layer is disposed on the sensor device and the upper surface of the semiconductor chip, and a carrier substrate is disposed on the first adhesive layer. The method further includes forming a plurality of vias in the semiconductor chip, the vias extending from a lower surface of the semiconductor chip to the upper surface of the semiconductor chip. The plurality of vias includes at least one first via contacting the connecting pad structure and exposing a part of the connecting pad structure; and at least one second via without contacting the connecting pad structure. The method further includes forming an isolation layer below the lower surface of the semiconductor chip, the isolation layer extends from the lower surface to the upper surface of the semiconductor chip, wherein a part of the isolation layer is disposed in the vias, and the part of the isolation layer is fully covering a sidewall of the first via and partially covering a sidewall of the second via. The method further includes forming a redistribution layer below the isolation layer and extending from the lower surface to the upper surface of the semiconductor chip, a part of the redistribution layer disposed in the vias, wherein the redistribution layer in the first via is electrically connected to the sensor device through the connecting pad structure.

In various embodiments of the present disclosure, after the operation of forming the redistribution layer, the method further includes precutting along a plurality of scribe lines between the semiconductor chip areas from the lower surface to the upper surface; forming a packaging layer below the redistribution layer; forming a plurality of solder balls below the packaging layer, and the solder ball electrically connected to the redistribution layer; and cutting along the plurality of scribe lines to remove partial first adhesive layer along the plurality of scribe lines and separate each of the semiconductor chips, but each of the semiconductor chips still attached below the carrier substrate.

In various embodiments of the present disclosure, after the operation of cutting along the plurality of scribe lines, the method further includes attaching a film frame carrier to connect the solder balls, and removing the carrier substrate on the semiconductor chips.

In various embodiments of the present disclosure, after the operation of removing the carrier substrate on the semiconductor chips, the method further includes attaching a second adhesive layer on the first adhesive layer, and removing the film frame carrier.

In various embodiments of the present disclosure, the first via and the second via are formed simultaneously by the same operation.

In various embodiments of the present disclosure, a depth of the first via extending from the lower surface to the upper surface is substantially the same with a depth of the second via extending from the lower surface to the upper surface.

In various embodiments of the present disclosure, the second via has a radius substantially not greater than 15 μm.

In various embodiments of the present disclosure, the operation of forming the packaging layer is performed by litho-etching processes to form a pattern of the packaging layer corresponding to a pattern of the redistribution layer.

In various embodiments of the present disclosure, the sensor device is an optical device.

In various embodiments of the present disclosure, a shortest distance from a light-receiving surface of the optical device to a bottom surface of the packaging layer is substantially not greater than 100 μm.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
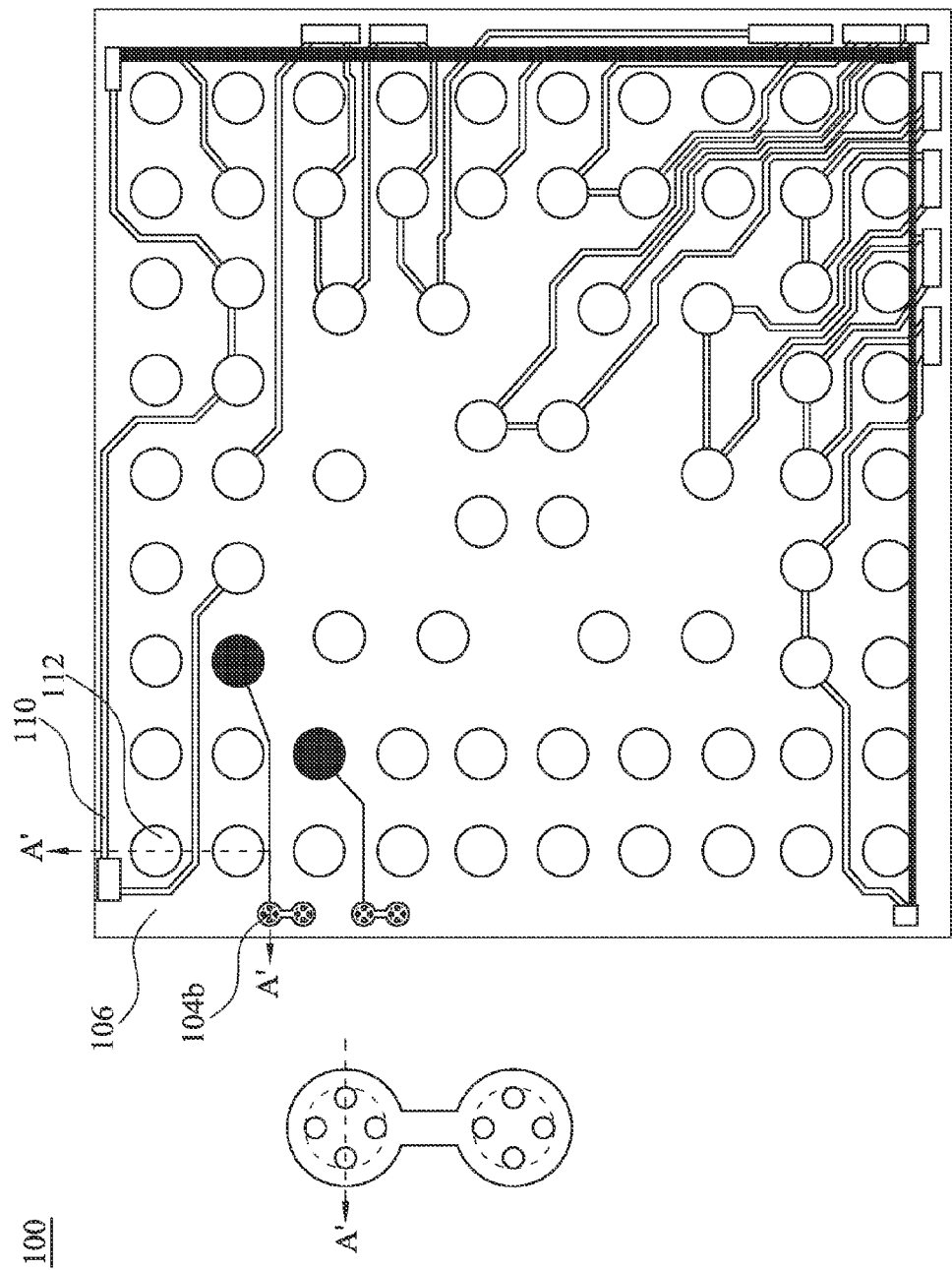
FIG. 1 is a top-view of a semiconductor chip package according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
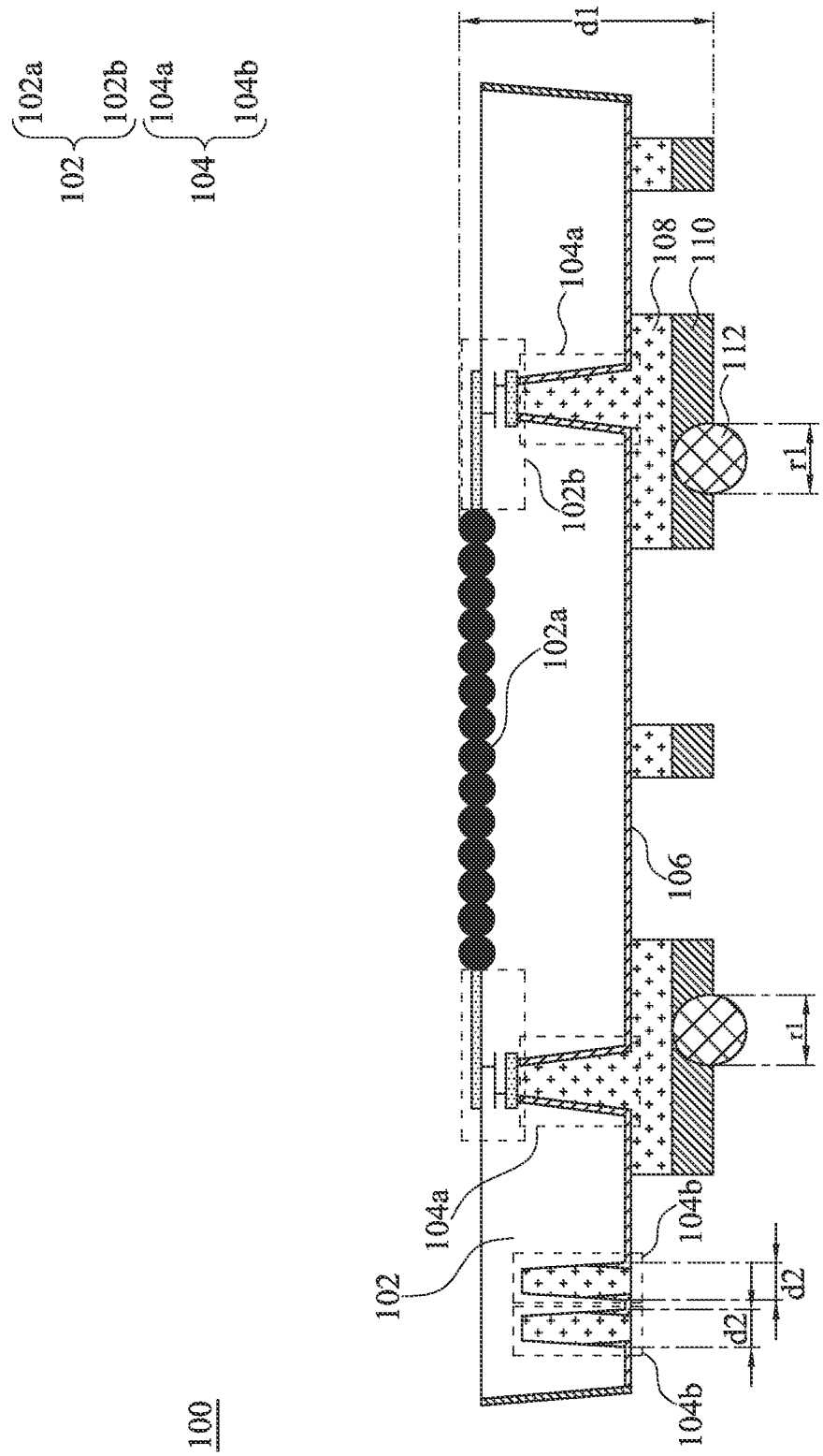
FIG. 2 is a cross-sectional view along AA' line in FIG. 1.

FIG. 1 is a top-view of a semiconductor chip package 100 according to various embodiments of the present disclosure; FIG. 2 is a cross-sectional view along AA' line in FIG. 1. Referring to FIG. 1 and FIG. 2, the semiconductor chip package 100 includes a semiconductor chip 102, a plurality of vias 104, isolation layer 106, a redistribution layer 108, and a packaging layer 110.

Referring to FIG. 2, the semiconductor chip 102 has at least one sensor device 102a and at least one connecting pad structure 102b. The sensor device 102a is disposed on an upper surface of the semiconductor chip 102. The sensor device 102a may be an optical sensing device such as complementary metal-oxide semiconductor chip or charge-coupled device. However, the present disclosure is not limited thereto. The connecting pad structure 102b is electrically connected to the sensor device 102a. In various embodiments of the present disclosure, the connecting pad structure 102b is extending from the upper surface of the semiconductor chip 102 to a lower surface of the semiconductor chip 102. As illustrated in FIG. 2, a part of the connecting pad structure 102b is disposed on the upper surface of the semiconductor chip 102 as sensor device 102a, such that the part of the connecting pad structure 102b is electrically connected to the sensor device 102a. Other part of the connecting pad structure 102b could be an interconnect structure. The interconnect structure extends from the upper surface of the semiconductor chip 102 to the lower surface of the semiconductor chip 102 to electrically connect another part of the connecting pad structure 102b in the semiconductor chip 102. Therefore, the sensor device 102a disposed on the upper surface of the semiconductor chip 102 could be electrically connected to inner part of the semiconductor chip 102 through the connecting pad structure 102b. However, the present disclosure is not limited thereto.

Referring to FIG. 2, the plurality of vias 104 are extending from the lower surface of the semiconductor chip 102 to the upper surface of the semiconductor chip 102. The plurality of vias 104 includes at least one first via 104a and at least one second via 104b. In other words, the plurality of vias 104 includes two different kinds of vias. It should be noticed that the size, position in the semiconductor chip package 100, and effect of the first via 104a are respectively different from the size, position in the semiconductor chip package 100, and effect of the second via 104b. In more detail, the first via 104a is extending from the lower surface of the semiconductor chip 102 to the upper surface of the semiconductor chip 102, and contacting to the connecting pad structure 102b in the semiconductor chip 102. Therefore, a part of the connecting pad structure 102b in the semiconductor chip 102 is exposed by the first via 104a. In other words, the first via 104a is through-silicon via (TSV) for being fulfilled by following redistribution layer 108. When the semiconductor chip package 100 is completed, the first via 104a is a vertical electrically conductive path from the lower surface of the semiconductor chip 102 to the sensor device 102a at the upper surface of the semiconductor chip 102. In various embodiments of the present disclosure, the first via 104a has a radius substantially 60 μm. The second via 104b is also extending from the lower surface of the semiconductor chip 102 to the upper surface of the semiconductor chip 102. However, the second via 104b is not contacting to the connecting pad structure 102b in the semiconductor chip 102. In other words, the second via 104b is substantially a ground via. Recently, due to miniaturization of the integrated circuit manufacturing process, the distances between metal lines of the integrated circuit are significantly reduced. Therefore the electrical coupling phenomenon between metal lines are getting serious and further reduce the signal integrity in metal lines of the integrated circuit. Accordingly, ground via is often adopted as a solution for aforementioned problem. In various embodiments of the present disclosure, the second via 104b has a radius substantially not greater than 15 μm. In various embodiments of the present disclosure, a depth of the first via 104a extending from the lower surface to the upper surface of the semiconductor chip 102 is substantially the same with a depth of the second via 104b extending from the lower surface to the upper surface of the semiconductor chip 102. Referring to FIG. 2, the lower surface of the semiconductor chip 102 is covered by the isolation layer 106. The isolation layer 106 may be silicon oxide, silicon nitride, silicon oxy-nitride, or other suitable isolating materials. Except for covering the lower surface of the semiconductor chip 102, the isolation layer 106 is extending from the lower surface of the semiconductor chip 102 to the upper surface of the semiconductor chip 102 through the plurality of vias 104 (including the first via 104a and the second via 104b), such that a part of the isolation layer 160 is disposed in side walls of the vias 104 (including the first via 104a and the second via 104b). It should be noticed that the part of the isolation layer 160 is fully covering a sidewall of the first via 104a and partially covering a sidewall of the second via 104b. The redistribution layer 108 is disposed below the isolation layer 106 and extending from the lower surface to the upper surface of the semiconductor chip 102. The redistribution layer 108 may be aluminum, copper, nickel, or other suitable materials. The redistribution layer 108 may be formed by depositing aforementioned materials to form a thin film, then the thin film is patterned by litho-etching processes to form a pattern corresponding to the first via 104a, the second via 104b, and metal lines layout on the lower surface of the semiconductor chip 102. The redistribution layer 108 is disposed below the isolation layer 106 and extending from the lower surface to the upper surface of the semiconductor chip 102, a part of the redistribution layer 108 is disposed in the vias 104 (including the first via 104a and the second via 104b) and fulfilling the first vias 104a and the second vias 104b. It should be noticed that the redistribution layer 108 in the first via 104a is electrically connected to the sensor device 102a through the connecting pad structure 102a since the redistribution layer 108 in the first vias 104a is contacting to the exposed part of the connecting pad structure 102b in the semiconductor chip 102. However, since the isolation layer 106 is fully covering the sidewall of the first vias 104a, the redistribution layer 108 in the first vias 104a is isolated from inner part of the semiconductor chip 102. On the other hand, since the isolation layer 106 is partially covering the sidewall of the second via 140b, the redistribution layer 108 in the second vias 104b is contacted to another part of sidewall of the second vias 104b, which is not covered by the isolation layer 106. Therefore, the redistribution layer 108 in the second vias 104b is contacted to the inner part of the semiconductor chip 102, and electrically grounded. As illustrated in FIG. 2, the packaging layer 110 is disposed below the redistribution layer 108. The packaging layer 110 may be solder mask, a popular material applied in semiconductor chip package. In various embodiments of the present disclosure, the semiconductor chip package 100 further includes at least one solder ball 112 disposed below the lower surface of the semiconductor chip 102, and the solder ball 112 is electrically connected to the redistribution layer 108. The packaging layer 110 has openings to expose a part of the redistribution layer 108 such that the solder ball 112 could be electrically connected to the part of the redistribution layer 108. Adjacent solder balls 112 could be isolated from contacting to each other by the packaging layer 110. The packaging layer 110 also could protect the redistribution layer 108. In various embodiments of the present disclosure, the sensor device is an optical-sensing device, and a shortest distance from a light-receiving surface of the optical device to a bottom surface of the packaging layer is substantially not greater than 100 μm. In various embodiments of the present disclosure, the packaging layer 110 may be formed by coating or depositing a packaging material film, and patterning the packaging material film by litho-etching processes. Therefore, the packaging layer 110 could has a pattern corresponding to the first vias 104a and metal lines on the lower surface of the semiconductor chip 102. In other words, the packaging layer 110 could be formed in a necessary pattern without being full coverage the lower surface of the semiconductor chip 102. Therefore, the risk of heat distortion in the packaging layer 110 could be significantly reduced, and die warpage problem during the following processes could also be eliminated. The solder ball 112 is disposed below the packaging layer 110, and electrically connected to the redistribution layer 108 through aforementioned opening of the packaging layer 110. The solder ball 112 may be tin (Sn), or other suitable conductive materials.

The method for fabricating the semiconductor chip package 100 in FIG. 2 according to various embodiments of the present disclosure will now be described in conjunction with FIG. 3-8.

Figure 3:
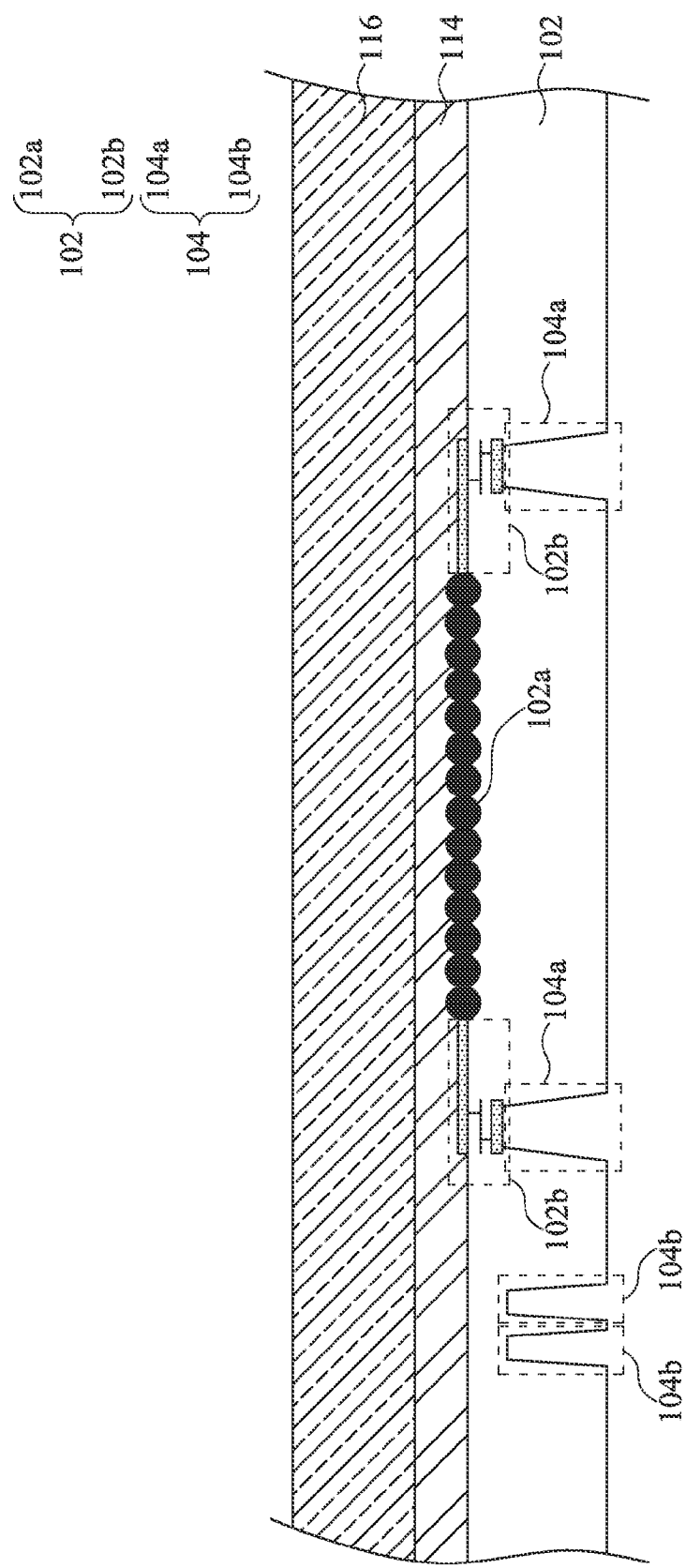
FIG. 3 is a schematic view of at least a portion of the semiconductor chip package in an intermediate stage of manufacture according to various embodiments of the present disclosure.

Referring to FIG. 3, FIG. 3 is a schematic view of at least a portion of the semiconductor chip package 100 in an intermediate stage of manufacture according to various embodiments of the present disclosure. A substrate with a plurality of semiconductor chips 102 is provided. A first adhesive layer 114 is attached on the substrate, and a carrier substrate 116 is attached on the first adhesive layer 114. A plurality of vias 104 is formed in the semiconductor chip 102. The vias 104 are extending from a lower surface of the semiconductor chip 102 to the upper surface of the semiconductor chip 102. In detail, the substrate may be silicon wafer of other semiconductor materials. The substrate is defined into a plurality of semiconductor chip areas. At least one semiconductor chip 102 is formed in the semiconductor chip area. As illustrated in FIG. 3, the substrate has a plurality of semiconductor chips 102. The semiconductor chip 102 has a sensor device 102a and at least one connecting pad structure 102b. The sensor device 102a is disposed on an upper surface of the semiconductor chip 102, and the connecting pad structure 102b is electrically connected to the sensor device 102a. The first adhesive layer 114 is disposed on the sensor device 102a and the upper surface of the semiconductor chip, and a carrier substrate is disposed. Therefore, the upper surface of the semiconductor chips 102 and the optical devices 102a on the upper surface of the semiconductor chip 102 are attached below the first adhesive layer 114. The carrier substrate 116 is disposed on the first adhesive layer 114. The first adhesive layer 114 could ensure the semiconductor chips 102 to attach below the carrier substrate 116, and protect the semiconductor chips 102 and the optical device 102a on the upper surface. The first adhesive layer 114 may be, but not limited to, an UV tape. The carrier substrate 116 could stabilize the semiconductor chips 102 during following cutting processes such that the semiconductor chips 102 would not drift from their predetermined positions. Therefore, accurate cutting processes to separate the semiconductor chips 102 could be achieved. In addition, the carrier substrate 116 also offers necessary physical support which is required on performing cutting processes. Next, the plurality of vias 104 are formed in the semiconductor chip 102. The vias 104 are extending from the lower surface of the semiconductor chip 102 to the upper surface of the semiconductor chip 102. The plurality of vias 104 includes at least one first via 104a and at least one second via 104b. The first vias 104a and the second vias 104b may be formed by litho-etching processes. However, the present disclosure is not limited thereto. In various embodiments of the present disclosure, the depth of the first via 104a extending from the lower surface to the upper surface is substantially the same with the depth of the second via 104b extending from the lower surface to the upper surface. It should be noticed that the size, position in the semiconductor chip package 100, and effect of the first via 104a are respectively different from the size, position in the semiconductor chip package 100, and effect of the second via 104b. In various embodiments of the present disclosure, the radius of the first via 104a is substantially 60 μm, and the radius of the second via 104b is substantially not greater than 15 μm. The radius of the second via 104b is less than that of the first via 104a. In various embodiments of the present disclosure, the first via 104a and the second via 104b are formed simultaneously by the same operation. The first via 104a and the second via 104b may be simultaneously formed by litho-etching processes or other techniques which are capable to form various radius of vias. In detail, the first via 104a is extending from the lower surface of the semiconductor chip 102 to the upper surface of the semiconductor chip 102 until contacting the connecting pad structure 102b in the semiconductor chip 102. Therefore, the first via 104a exposes a part of the connecting pad structure 102b in the semiconductor chip 102. On the other hand, the second via 104b does not contact the connecting pad structure 102b in the semiconductor chip 102. In other words, the second via 104b is substantially a ground via.

Figure 4:
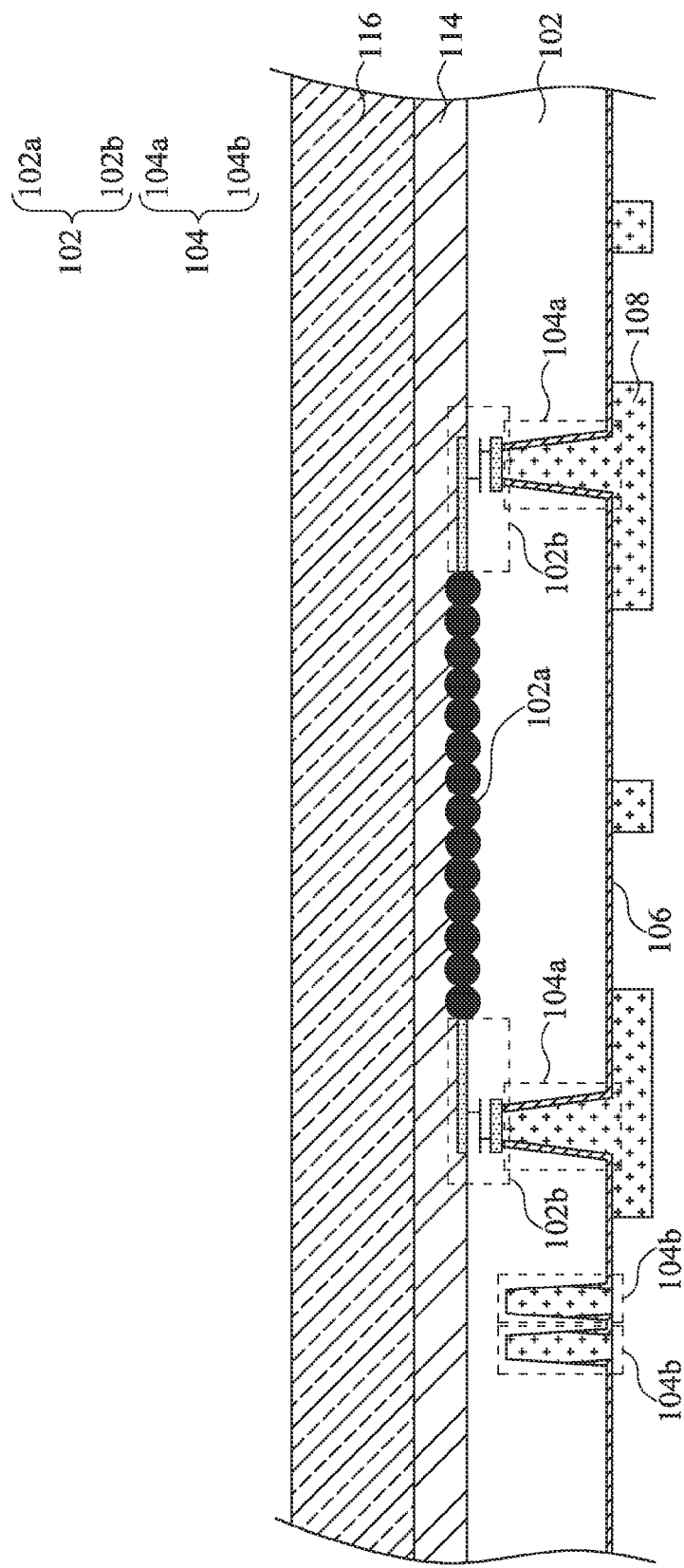
FIG. 4 is a schematic view of at least a portion of the semiconductor chip package in an intermediate stage of manufacture according to various embodiments of the present disclosure.

Referring to FIG. 4, FIG. 4 is a schematic view of at least a portion of the semiconductor chip package 100 in an intermediate stage of manufacture according to various embodiments of the present disclosure. The isolation layer 106 and the redistribution layer 108 are formed. The isolation layer 106 is formed below the lower surface of the semiconductor chips 102. The isolation layer 106 extends from the lower surface to the upper surface of the semiconductor chip. A part of the isolation layer 106 is disposed in the vias 104, and the part of the isolation layer 106 is fully covering a sidewall of the first via 104a and partially covering a sidewall of the second via 104b. The isolation layer 106 may be silicon oxide, silicon nitride, silicon oxynitride or other suitable isolating materials, and the isolation layer 106 may be formed by chemical vapor deposition (CVD). However, the present disclosure is not limited thereto. It should be noticed that the part of the isolation layer 106 is fully covering the sidewall of the first via 104a and is not fully covering the sidewall of the second via 104b. Since various thin film deposition techniques have different gap-filling capabilities, a proper thin film deposition technique might be chosen to gap-fill a via with a specific via depth, via radius (opening), and ratio of via depth and via radius (aspect ratio). Therefore, only thin film deposition techniques with higher gap-filling capabilities could successfully gap-fill a via with smaller via radius or higher aspect ratio. Beside, materials and other process parameters might also affect gap-filling capabilities of a thin film deposition technique. Because the radius of the second via 104b is smaller than that of the first via 104a, it is reasonable to choose a thin film deposition technique to deposit the isolation layer 106 which is fully covering fully covering the sidewall of the first via 104a and partially covering the sidewall of the second via 104b. In addition, proper materials and other process parameters may also be applied to deposit the isolation layer 106 which is fully covering fully covering the sidewall of the first via 104a and partially covering the sidewall of the second via 104b. Next, the redistribution layer 108 is formed below the isolation layer 106. The redistribution layer 108 may be aluminum, copper, nickel, or other suitable conductive materials. The redistribution layer 108 may be formed by sputtering, evaporating, electroplating, or electroless plating a thin film of aforementioned conductive materials. The thin film of aforementioned conductive materials is patterned to leave the redistribution layer 108 which is disposed below the isolation layer 106 and corresponding to the first via 104a, the second via 104b, and metal lines layout on the lower surface of the semiconductor chip 102. The operation of patterning the thin film of aforementioned conductive materials could redistribute signal-conducting paths of the semiconductor chip package 100. The redistribution layer 108 is disposed below the isolation layer 106 and extending from the lower surface to the upper surface of the semiconductor chip 102. A part of the redistribution layer 106 is disposed in the vias 104. It should be noticed that the redistribution layer 106 in the first via 104a is electrically connected to the sensor device 102a through the connecting pad structure 102b. The first via 104a and the second via 104b are fulfilled by the redistribution layer 108. For example, a metal thin film technique with better gap-filling capability could be applied to non-selectively gap-fill all of the first via 104a and the second via 104b. Therefore, the redistribution layer 108 in the first via 104a is not contacted to and electrically isolated to the semiconductor chip 102; and the redistribution layer 108 in the second via 104b is contacted to another part of sidewall of the second via 104b, which is not covered by the isolation layer 106, and electrically grounded by the inner part of the semiconductor chip 102.

Figure 5:
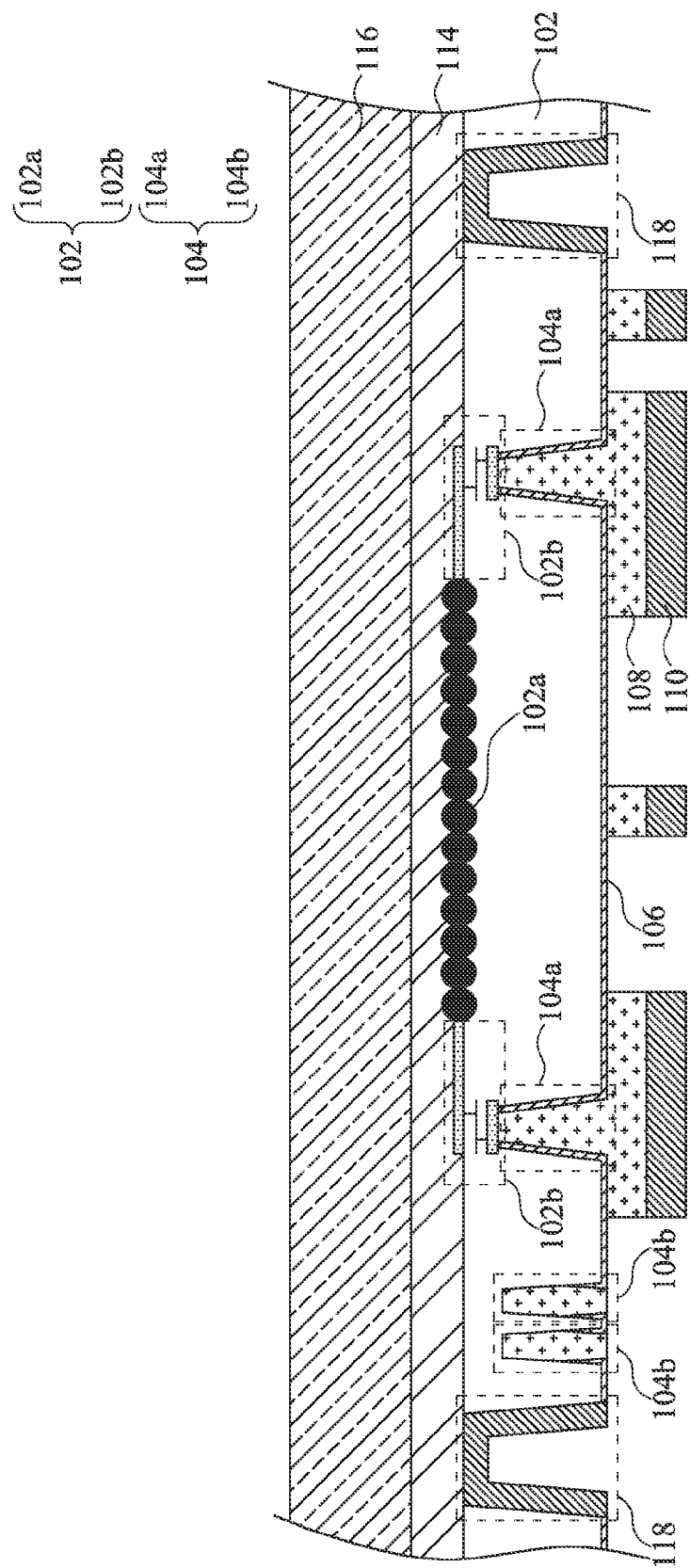
FIG. 5 is a schematic view of at least a portion of the semiconductor chip package in an intermediate stage of manufacture according to various embodiments of the present disclosure.

Referring to FIG. 5, FIG. 5 is a schematic view of at least a portion of the semiconductor chip package 100 in an intermediate stage of manufacture according to various embodiments of the present disclosure. A plurality of scribe lines 118 between the semiconductor chips 102 are formed by precutting a plurality of boundaries between the semiconductor chip areas. The operation of pre-cutting is performed from the lower surface to the upper surface. The operation of pre-cutting could be performed by dryetching. However, the present disclosure is not limited thereto. Next, a packaging layer 110 is formed below the redistribution layer 110. The packaging layer 110 may be solder mask. In various embodiments of the present disclosure, the sensor device is an optical-sensing device, and a shortest distance from a light-receiving surface of the optical device to a bottom surface of the packaging layer is substantially not greater than 100 μm. In various embodiments of the present disclosure, the packaging layer 110 may be formed by coating or depositing a thin film of packaging materials. The thin film of packaging materials is patterned to leave the packaging layer 110 corresponding to the first via 104a and metal lines layout on the lower surface of the semiconductor chip 102. In other words, the packaging layer 110 is not fully covering the semiconductor chip 102. Therefore, the issue of die warpage caused by following thermal processes can be further improved.

Figure 6:
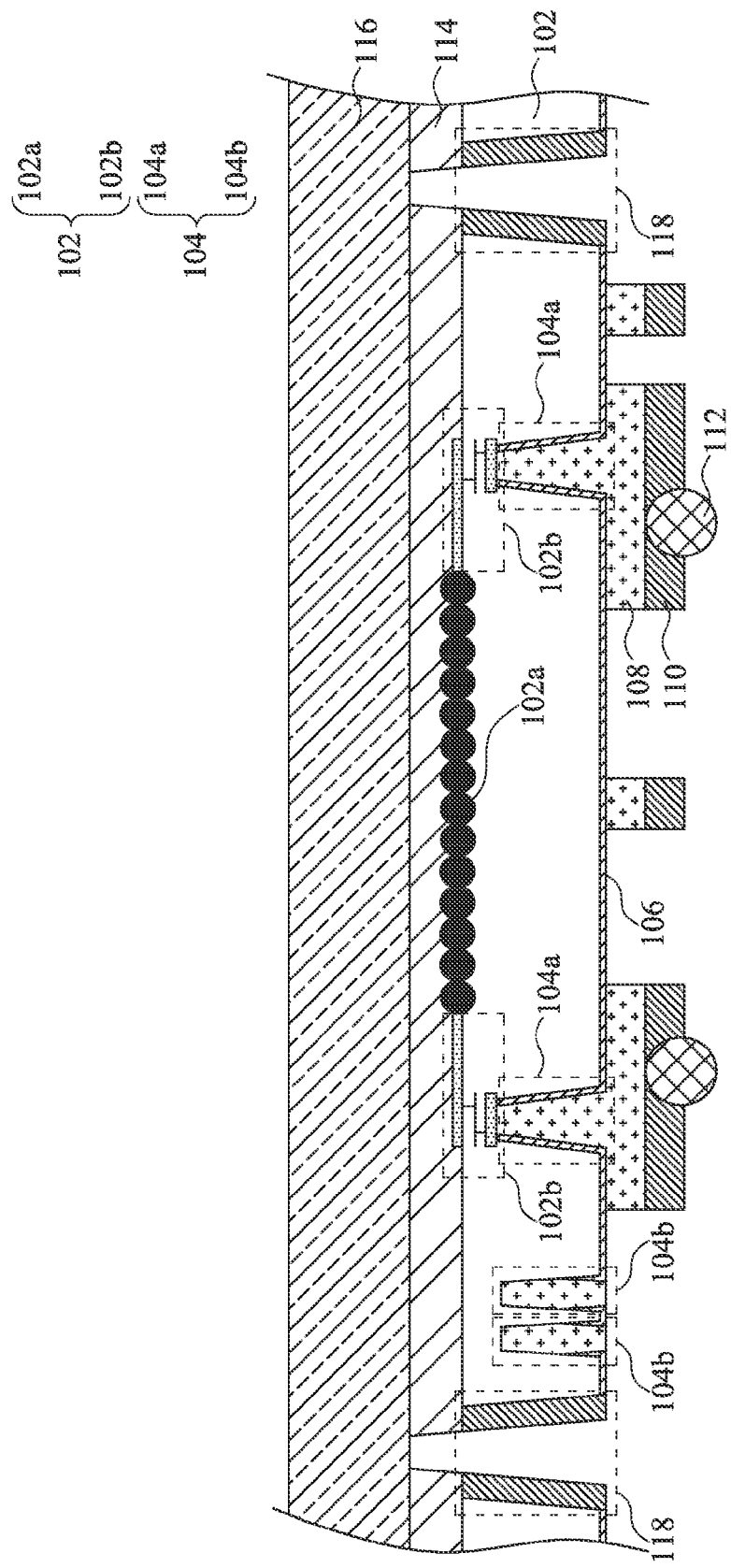
FIG. 6 is a schematic view of at least a portion of the semiconductor chip package in an intermediate stage of manufacture according to various embodiments of the present disclosure.

Referring to FIG. 6, FIG. 6 is a schematic view of at least a portion of the semiconductor chip package 100 in an intermediate stage of manufacture according to various embodiments of the present disclosure. At least one solder ball 112 is formed below the packaging layer 110, and the solder ball 112 is electrically connected to the redistribution layer 108. Next, cutting along the plurality of scribe lines to remove partial first adhesive layer along the plurality of scribe lines 118 and separate each of the semiconductor chips 102. Part of the first adhesive layer 114 is removed to separate the semiconductor chips 102. Each of the semiconductor chips 102 is still attached below the carrier substrate 116.

Figure 7:
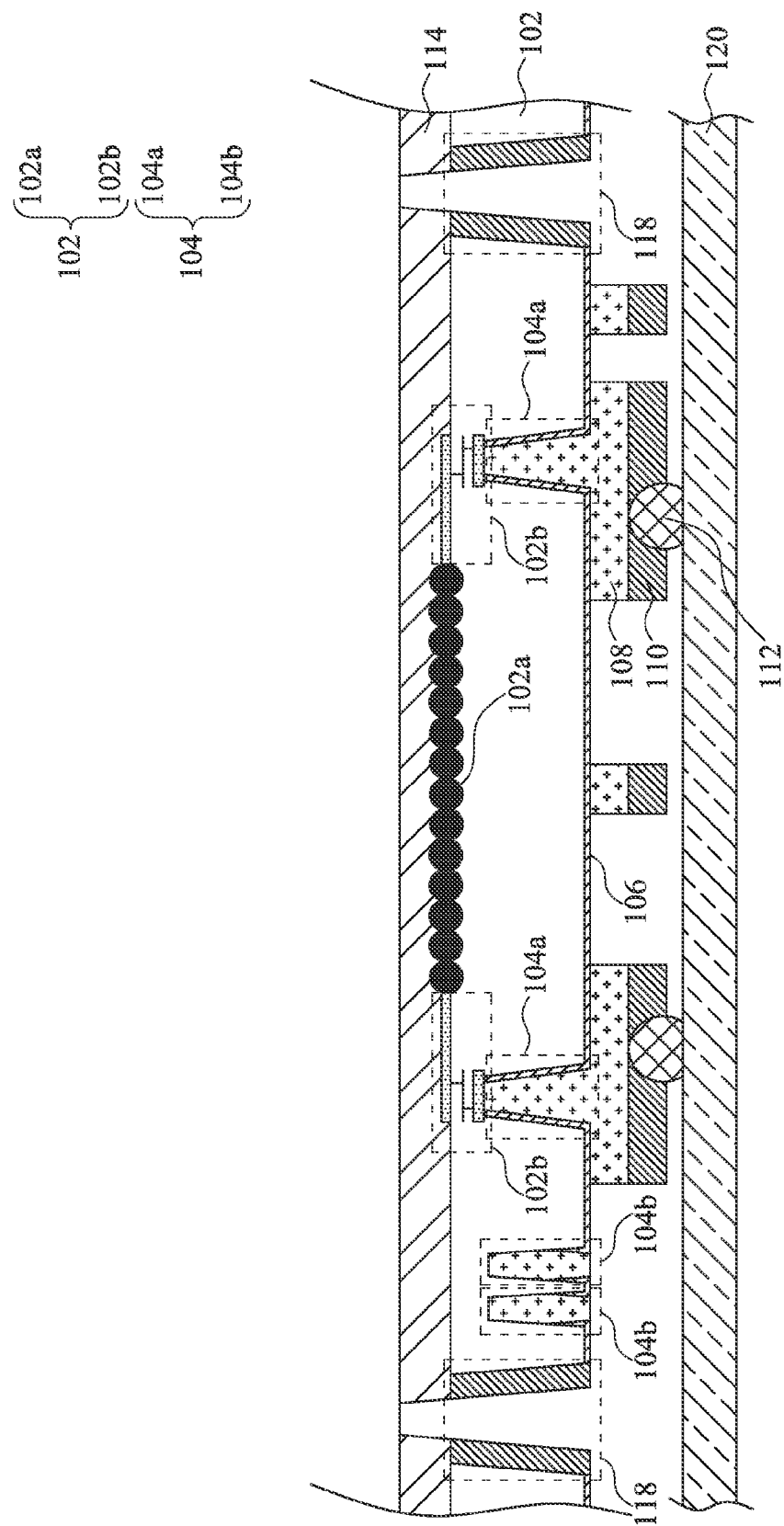
FIG. 7 is a schematic view of at least a portion of the semiconductor chip package in an intermediate stage of manufacture according to various embodiments of the present disclosure.
Figure 8:
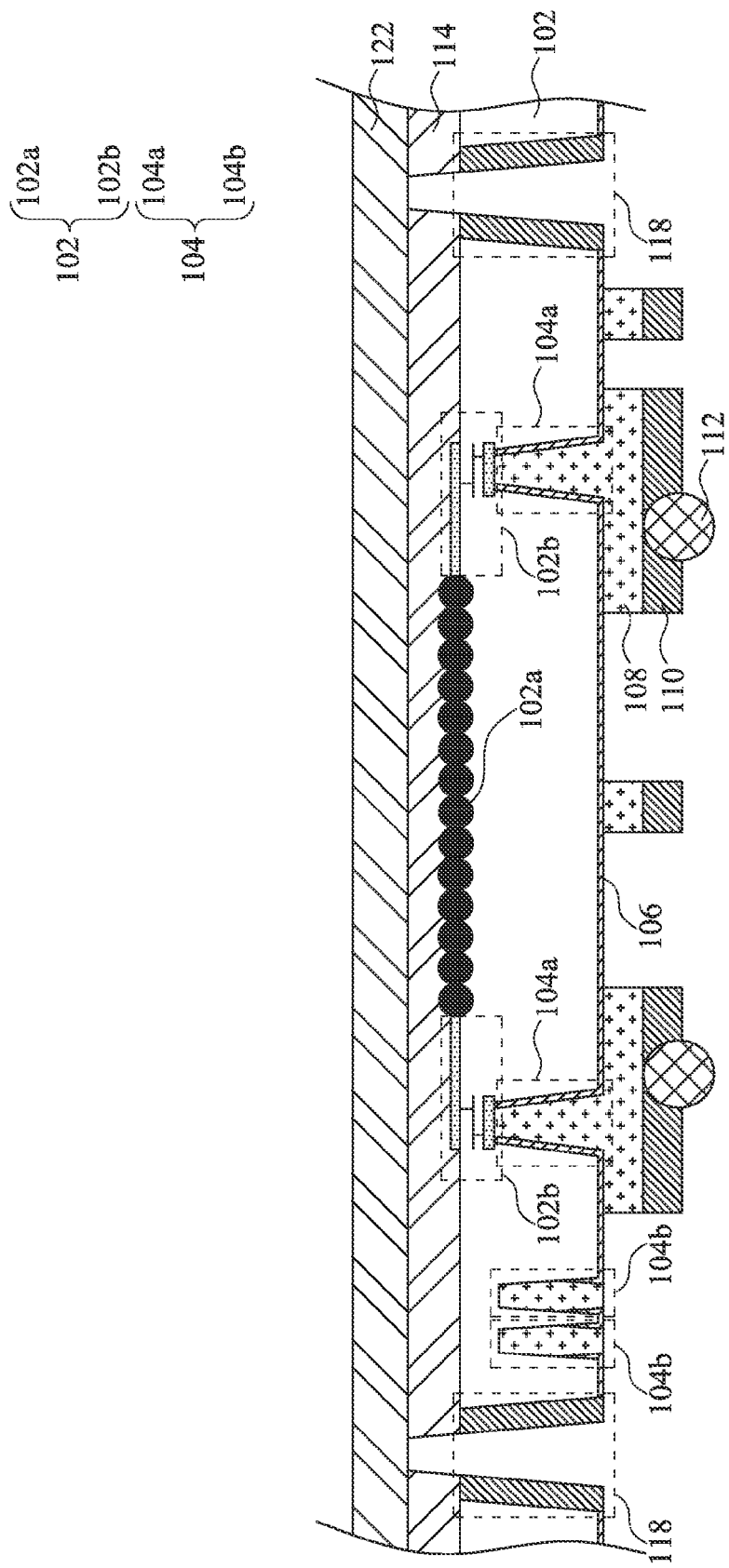
FIG. 8 is a schematic view of at least a portion of the semiconductor chip package in an intermediate stage of manufacture according to various embodiments of the present disclosure.

Referring to FIG. 7, FIG. 7 is a schematic view of at least a portion of the semiconductor chip package 100 in an intermediate stage of manufacture according to various embodiments of the present disclosure. A film frame carrier 120 is attached to connect the solder balls 112, and removing the carrier substrate 116 on the semiconductor chips 102. Referring to FIG. 8, FIG. 8 is a schematic view of at least a portion of the semiconductor chip package 100 in an intermediate stage of manufacture according to various embodiments of the present disclosure. The semiconductor chip packages 100 could be further fabricated in rolls for transport convenience. In various embodiments of the present disclosure, after the carrier substrate 116 is removed form the semiconductor chips 102, a second adhesive layer 122 is attached on the first adhesive layer 114, and the film frame carrier 120 is removed. Therefore, a rolling direction could be reversed to cope with various rolling machines. Accordingly, the way of rolling the semiconductor chip packages 100 for transport could be more flexible.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor chip package, comprising:
   a semiconductor chip having at least one sensor device and at least one connecting pad structure, wherein the sensor device is disposed on an upper surface of the semiconductor chip, and the connecting pad structure is electrically connected to the sensor device;
   a plurality of vias extending from a lower surface of the semiconductor chip to the upper surface of the semiconductor chip, wherein the plurality of vias comprises:
      at least one first via contacting the connecting pad structure and exposing a part of the connecting pad structure; and
      at least one second via without contacting the connecting pad structure, wherein a depth of the first via extending from the lower surface to the upper surface is substantially the same with a depth of the second via extending from the lower surface to the upper surface; and
   a redistribution layer extending from the lower surface to the upper surface of the semiconductor chip, a part of the redistribution layer disposed in the vias, wherein the redistribution layer in the first via is electrically connected to the sensor device through the connecting pad structure, and the redistribution layer in the second via contacts sidewalls of the second via.

2. The semiconductor chip package of claim 1, wherein the second via has a radius substantially not greater than 15 µm.

3. The semiconductor chip package of claim 1, wherein the sensor device is an optical device.

4. The semiconductor chip package of claim 3, wherein a shortest distance from a light-receiving surface of the optical device to a bottom surface of the packaging layer is substantially not greater than 100 µm.

5. A semiconductor chip package of claim 1, further comprising:
   a semiconductor chip having at least one sensor device and at least one connecting pad structure, wherein the sensor device is disposed on an upper surface of the semiconductor chip, and the connecting pad structure is electrically connected to the sensor device;
   a plurality of vias extending from a lower surface of the semiconductor chip to the upper surface of the semiconductor chip, wherein the plurality of vias comprises:
      at least one first via contacting the connecting pad structure and exposing a part of the connecting pad structure; and
      at least one second via without contacting the connecting pad structure;
   a redistribution layer extending from the lower surface to the upper surface of the semiconductor chip, a part of the redistribution layer disposed in the vias, wherein the redistribution layer in the first via is electrically connected to the sensor device through the connecting pad structure, and the redistribution layer in the second via contacts sidewalls of the second via; and
   an isolation layer extending from the lower surface to the upper surface of the semiconductor chip, wherein a part of the isolation layer is disposed in the vias, and the part of the isolation layer fully covers a sidewall of the first via and partially covers a sidewall of the second via.

6. The semiconductor chip package of claim 1, wherein the semiconductor chip package has no carrier substrate disposed on the upper surface of the semiconductor chip.

7. A method for manufacturing a semiconductor chip package, comprising:
   providing a substrate, wherein the substrate is defined into a plurality of semiconductor chip area, each semiconductor chip area has at least one semiconductor chip, the semiconductor chip has a sensor device and at least one connecting pad structure, wherein the sensor device is disposed on an upper surface of the semiconductor chip, and the connecting pad structure is electrically connected to the sensor device, a first adhesive layer is disposed on the sensor device and the upper surface of the semiconductor chip, and a carrier substrate is disposed on the first adhesive layer;
   forming a plurality of vias in the semiconductor chip, the vias extending from a lower surface of the semiconductor chip to the upper surface of the semiconductor chip, wherein the plurality of vias comprises:
      at least one first via contacting the connecting pad structure and exposing a part of the connecting pad structure; and
      at least one second via without contacting the connecting pad structure, wherein a depth of the first via extending from the lower surface to the upper surface is substantially the same with a depth of the second via extending from the lower surface to the upper surface; and
   forming a redistribution layer below the lower surface of the semiconductor chip, the redistribution layer extending from the lower surface to the upper surface of the semiconductor chip, a part of the redistribution layer disposed in the vias, wherein the redistribution layer in the first via is electrically connected to the sensor device through the connecting pad structure, and the redistribution layer in the second via contacts sidewalls of the second via.

8. The method of claim 7, after the operation of forming the redistribution layer, further comprising:
  precutting along a plurality of scribe lines between the semiconductor chip areas from the lower surface to the upper surface;
  forming a plurality of conductive external connections below the lower surface of the semiconductor chip, and the conductive external connections electrically connected to the redistribution layer; and
  cutting along the plurality of scribe lines to remove partial first adhesive layer along the plurality of scribe lines and separate each of the semiconductor chips, but each of the semiconductor chips still attached below the carrier substrate.

9. The method of claim 8, after the operation of cutting along the plurality of scribe lines, further comprising:
  attaching a film frame carrier to connect the conductive external connections, and removing the carrier substrate on the semiconductor chips.

10. A method for manufacturing a semiconductor chip package, comprising:
  providing a substrate, wherein the substrate is defined into a plurality of semiconductor chip area, each semiconductor chip area has at least one semiconductor chip, the semiconductor chip has a sensor device and at least one connecting pad structure, wherein the sensor device is disposed on an upper surface of the semiconductor chip, and the connecting pad structure is electrically connected to the sensor device, a first adhesive layer is disposed on the sensor device and the upper surface of the semiconductor chip, and a carrier substrate is disposed on the first adhesive layer;
  forming a plurality of vias in the semiconductor chip, the vias extending from a lower surface of the semiconductor chip to the upper surface of the semiconductor chip, wherein the plurality of vias comprises:
    at least one first via contacting the connecting pad structure and exposing a part of the connecting pad structure; and
    at least one second via without contacting the connecting pad structure;
  forming a redistribution layer below the lower surface of the semiconductor chip, the redistribution layer extending from the lower surface to the upper surface of the semiconductor chip, a part of the redistribution layer disposed in the vias, wherein the redistribution layer in the first via is electrically connected to the sensor device through the connecting pad structure;
  precutting along a plurality of scribe lines between the semiconductor chip areas from the lower surface to the upper surface;
  forming a plurality of conductive external connections below the lower surface of the semiconductor chip, and the conductive external connections electrically connected to the redistribution layer;
  cutting along the plurality of scribe lines to remove partial first adhesive layer along the plurality of scribe lines and separate each of the semiconductor chips, but each of the semiconductor chips still attached below the carrier substrate;
  attaching a film frame carrier to connect the conductive external connections, and removing the carrier substrate on the semiconductor chips; and
  attaching a second adhesive layer on the first adhesive layer, and removing the film frame carrier.

11. The method of claim 7, wherein the first via and the second via are formed simultaneously by the same operation.

12. The method of claim 7, wherein the second via has a radius substantially not greater than 15 μm.

13. The method of claim 7, further comprising forming a packaging layer below the redistribution layer, wherein the operation of forming the packaging layer is performed by litho-etching processes to form a pattern of the packaging layer corresponding to a pattern of the redistribution layer.

14. The method of claim 7, wherein the sensor device is an optical device.

15. The method of claim 14, wherein a shortest distance from a light-receiving surface of the optical device to a bottom surface of the packaging layer is substantially not greater than 100 μm.

16. The method of claim 7, further comprising forming an isolation layer below the lower surface of the semiconductor chip, and forming the redistribution layer below the isolation layer.

17. The method of claim 16, wherein the isolation layer extends from the lower surface to the upper surface of the semiconductor chip, a part of the isolation layer disposed in the vias and fully covering a sidewall of the first via and partially covering a sidewall of the second via.

18. The semiconductor chip package of claim 5, wherein the redistribution layer is disposed below the isolation layer.

* * * * *